(12) United States Patent
Ogasawara

(10) Patent No.: US 7,697,592 B2
(45) Date of Patent: Apr. 13, 2010

(54) SPREAD SPECTRUM CLOCK GENERATING APPARATUS

(75) Inventor: Kazuo Ogasawara, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 1296 days.

(21) Appl. No.: 10/853,534

(22) Filed: May 26, 2004

(65) Prior Publication Data

US 2004/0252751 A1 Dec. 16, 2004

(30) Foreign Application Priority Data

Jun. 11, 2003 (JP) ............................. 2003-166711

(51) Int. Cl.
H04B 1/00 (2006.01)
(52) U.S. Cl. .................... 375/130; 375/373; 375/355; 375/329; 375/334
(58) Field of Classification Search ................ 375/130, 375/373, 355, 329, 334
See application file for complete search history.

(56) References Cited

U.S. PATENT DOCUMENTS

| 4,639,682 | A * | 1/1987 | Takeuchi | 329/307 |
| 6,380,774 | B2 * | 4/2002 | Saeki | 327/119 |
| 6,791,385 | B2 * | 9/2004 | Saeki | 327/163 |
| 7,206,370 | B2 * | 4/2007 | Nakao | 375/376 |
| 2002/0021153 | A1 | 2/2002 | Saeki | |
| 2003/0038659 | A1 * | 2/2003 | Takahashi et al. | 327/141 |
| 2003/0048863 | A1 * | 3/2003 | Saeki | 375/376 |
| 2003/0112079 | A1 * | 6/2003 | Saeki et al. | 331/1 A |
| 2003/0122596 | A1 * | 7/2003 | Saeki | 327/127 |
| 2004/0001600 | A1 * | 1/2004 | Kim et al. | 381/100 |
| 2004/0071251 | A1 * | 4/2004 | Sutioso et al. | 375/373 |

FOREIGN PATENT DOCUMENTS

JP   7-235862   9/1995

(Continued)

OTHER PUBLICATIONS

Mitsutoshi Sugawara, et al., "1.5 Gbps, 5150 ppm Spread Spectrum SerDes PHY with a 0.3 mW, 1.5 Gbps Leel Detector for Serial ATA", 2002 Symposium on VLSI Circuits Digest of Technical Papers, Jun. 2002.

(Continued)

Primary Examiner—Shuwang Liu
Assistant Examiner—Kabir A Timory
(74) Attorney, Agent, or Firm—McGinn IP Law Group, PLLC

(57) ABSTRACT

A spread spectrum clock generator capable of generating a smooth spread spectrum clock while suppressing an increase in the size of the circuitry includes a phase interpolator, receiving a clock signal from a clock input terminal and a control signal (an up signal and/or down signal) are input, for adjusting the phase of an output clock signal in accordance with the control signal and outputting the resultant clock signal, and a control circuit for counting the clock signal that enters from the clock input terminal and outputting the control signal to the phase interpolator, the control signal varying the phase of the output clock signal based upon the count result. The phase of the output clock signal from the phase interpolator varies with time and is frequency-modulated within a prescribed frequency range.

23 Claims, 8 Drawing Sheets

FOREIGN PATENT DOCUMENTS

| | | |
|---|---|---|
| JP | 11-15550 | 1/1999 |
| JP | 2001-92311 A | 4/2001 |
| JP | 2001-148690 | 5/2001 |
| JP | 2001-345790 | 12/2001 |
| JP | 2002-43904 | 2/2002 |
| JP | 2002-73199 | 3/2002 |
| JP | 2002-190724 | 7/2002 |

OTHER PUBLICATIONS

S. Sidiropoulos and Mark Horowitz et al., "A Semi-Digital DLL with Unliminted Phase Shift Capability and 0.08-400 MHz Operating Range", ISSCC 1997 pp. 332-333.

Japanese Office Action dated Jan. 13, 2009 (including partial translation).

Japanese Office Action dated Sep. 15, 2009 with partial English-language translation.

\* cited by examiner

SPREAD SPECTRUM CLOCK GENERATING APPARATUS

FIELD OF THE INVENTION

This invention relates to a clock generating circuit and, more particularly, to a spread spectrum clock generator.

BACKGROUND OF THE INVENTION

When a clock generator in an electronic device generates a single frequency, emission increases at the frequency and higher harmonics. For this reason, use is made of a spread spectrum clock generator that reduces the peak of unnecessary emissions by frequency modulation and diminishes EMI (electromagnetic interference).

A PLL (phase-locked loop) in which a pulse-swallow frequency divider is provided in a feedback counter generally is used as a conventional spread spectrum clock generator of this kind (e.g., see M. Sugawara, T. Ishibashi, K. Ogasawara, M. Aoyama, M. Zwerg, S. Glowinski, Y. Kameyama, T. Yanagita, M. Fukaishi, S. Shimoyama, T. Ishibashi and T. Noma, "1.5 Gbps, 5150 ppm Spread Spectrum SerDes PHY with a 0.3 mW, 1.5 Gbps Level Detector for Serial ATA", Symposium on VLSI Circuits Digest of Technical Paper 5-3, FIG. 1, June/2002). This PLL implements frequency modulation by affording two integers A and A-1 as divider ratios and switching between A and A-1. By changing the proportions of A and A-1 at predetermined fixed intervals, average frequency f is varied to thereby generate a spread spectrum clock.

With a PLL having a pulse-swallow frequency divider provided in a feedback counter, a single pulse of a step phase error enters the PLL as an input when the frequency divider is changed over. Since the PLL is in the negative feedback loop, a transient response is caused by the entered step phase error. It is expected that if the damping factor of the negative feedback loop is large, the clock frequency will vary out of specs owing to the transient response. If the damping factor is small, on the other hand, there is a possibility that the stability of the loop will be lost. Furthermore, since the characteristic of a spread spectrum clock generator is decided by control of the pulse-swallow frequency divider and the overall characteristic of transient response due to step phase error, a large number of design parameters exists and labor expended in optimizing design increases.

It should be noted that the PLL described in the above-cited reference is equipped with the pulse-swallow frequency divider and is so adapted that a smooth characteristic is obtained by using post-filtering. However, the reference is silent on information (measures) regarding a fluctuation in the PLL characteristic.

A spread spectrum clock generating circuit having a PLL, which is equipped with a plurality of program counters, and a frequency modulating circuit also is known [e.g., see the specification of Japanese Patent Kokai Publication No. JP-A-7-235862 (pages 9, 10 and FIGS. 6, 7, 8 and 9)].

Also known is a clock generating apparatus comprising a clock generator for generating m-phase clock signals having a phase difference between them; a selection processor for successively selecting one of the m-phase clock signals generated by the clock generator to thereby generate a second clock signal; and a dithering controller for supplying the selection processor with a control signal so that the phase of the second clock signal obtained from the selection processor will fluctuate within a prescribed range and the peak of a spectrum will be dispersed (e.g., see the specification of Japanese Patent Kokai Publication No. JP-P2001-148690A (pages 3 and 10 and FIGS. 3 and 11)]. The clock generating apparatus of this patent reference is equipped with a delay circuit or ring oscillator as the m-phase clock generator. FIG. 8 is a diagram illustrating the structure of the clock generator described in this patent reference, the generator using a ring oscillator 110 to generate a 5-phase clock. As shown in FIG. 8, five inverting delay circuits 111 to 115 are connected in ring form and clocks c0 to c4 of five phases are extracted from the outputs of the respective delay circuits via buffers 116 to 120, respectively. Reference numerals 121 to 125 denote frequency divider circuits.

In the prior art in which plural (m) clock generators such as a plurality of delay circuits are used in generating multiple-phase (m-phase) clock signals, as described in this patent reference, the amount of delay in the delay circuits fluctuates owing to changes in power-supply voltage and operating temperature, etc., if the delay circuits are constructed in an integrated circuit. Accordingly, a clock generator of m different phases requires the provision of delay circuits of m or more phases for the purpose of accommodating for the amount of fluctuation. As a consequence, control is complicated and it is necessary to finely adjust the amount of delay of the delay circuits.

Further, with the arrangement described in this patent reference, m (five in FIG. 8) clock generators are provided to deal with phase lead or lag of the clock. When the phase of a clock makes one full cycle, a smooth, seamless transition is desired with the same amount of delay. However, it is difficult to achieve a smooth, seamless transition owing to the fine adjustment of amount of delay and the use of m or more clock generators.

In a case where clocks of m different phases are generated by the ring oscillator 110, as shown in FIG. 8, this is technically feasible when the number of m-phase ring oscillators is small. In order to stabilize frequency, however, PLL (phase-locked loop) techniques are required. Further, if it is attempted to finely adjust phase resolution by increasing the number of clock generators for m different phases, the oscillating frequency of the ring oscillator will decline and the required frequency will no longer be obtained.

[Non-patent Document 1]
M. Sugawara, T. Ishibashi, K. Ogasawra, M. Aoyama, M. Zwerg, S. Glowinski, Y. Kameyama, T. Yanagita, M. Fukaishi, S. Shimoyama, T. Ishibashi and T. Noma, "1.5 Gbps, 5150 ppm Spread Spectrum SerDes PHY with a 0.3 mW, 1.5 Gbps Level Detector for Serial ATA", Symposium on VLSI Circuits Digest of Technical Paper 5-3, FIG. 1, June/2002

[Non-patent Document 2]
S. Sidiropoulos and Mark Horowitz et. al., "A Semi-Digital DLL with Unlimited Phase Shift Capability and 0.08-400 MHz Operating Range," ISSCC 1997 pp. 332-333

[Patent Document 1]
Japanese Patent Kokai Publication No. JP-P2001-148690A (pages 3 and 10 and FIGS. 3 and 11)

[Patent Document 2]
Japanese Patent Kokai Publication No. JP-A-7-235862 (pages 9, 10 and FIGS. 6, 7, 8 and 9)

[Patent Document 3]
Japanese Patent Kokai Publication No. JP-P2002-190724A (pages 8 and 9, FIG. 6)

SUMMARY OF THE INVENTION

Accordingly, an object of the present invention is to provide a clock generating apparatus that is capable of generating a smooth spread spectrum clock while suppressing an increase in the size of the circuitry without using a pulse-swallow frequency divider and VCO (voltage-controlled oscillator).

The above and other objects are attained by a spread spectrum clock generating apparatus in accordance with a first aspect of the present invention, which comprises a phase interpolator receiving an input clock signal and a control signal and varying phase of an output clock signal in accordance with the control signal and outputting the resultant output signal; and a control circuit receiving and counting the input clock signal input thereto, generating the control signal, which is for varying the phase of the output clock signal, based upon the count result, and supplying the so generated control signal to the phase interpolator.

In the present invention, the control circuit preferably generates the control signal in such a manner that the frequency of the output clock signal makes a round trip over a prescribed frequency range, in an interval that is a prescribed multiple of the period of the input clock signal, this interval serving as one modulation cycle.

In the present invention, the control signal supplied from the control circuit to the phase interpolator includes an up signal, which advances the phase of the output clock signal a prescribed amount, and a down signal, which retards the phase of the output clock signal a prescribed amount, and the control circuit exercises control so as to activate, a prescribed number of times, the up signal and/or down signal based upon the count every prescribed number of periods predetermined with regard to the input clock signal, and supply the activated signal to the phase interpolator.

In the clock generating apparatus in accordance with another aspect of the present invention, the control circuit outputs a down signal to the phase interpolator as the control signal every prescribed number of periods with regard to the input clock signal, the down signal retarding the phase of the output clock signal a prescribed amount. (This arrangement supports downspread specs, described later.)

In accordance with the present invention having this arrangement, a smooth spread-spectrum clock can be obtained from the phase interpolator.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Figure 1:
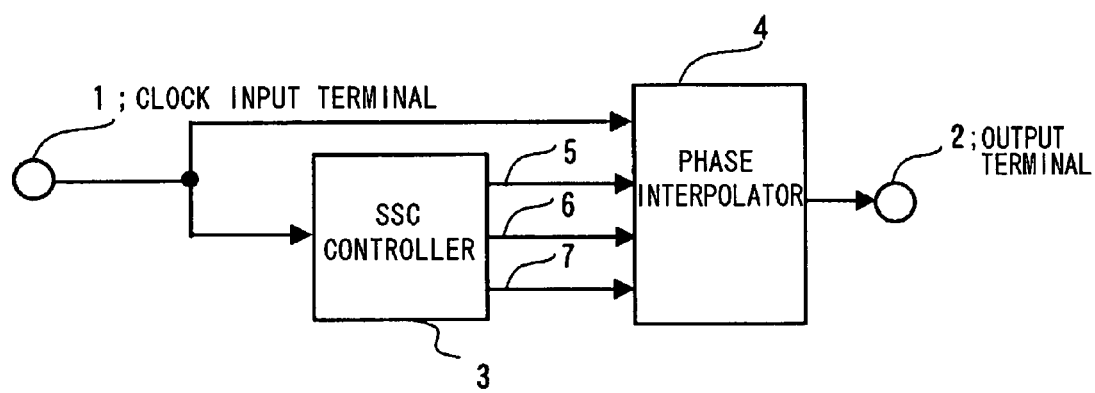
FIG. 1 is a block diagram illustrating a first embodiment of the present invention.

Preferred embodiments of the present invention will now be described in detail with reference to the drawings. The principle of the invention will be described first, followed by a description of the preferred embodiments. A spread spectrum clock generating apparatus in the preferred embodiments is equipped with a controller 3 and a phase interpolator 4 for adjusting the phase of an output clock signal. A clock signal from a clock input terminal 1 and control signals (inclusive of an up signal 6 and a down signal 7) from the controller 3 are supplied to the phase interpolator 4, which adjusts the phase of the output clock signal in accordance with the control signals and outputs the resultant signal.

The controller 3 counts the clock signal input thereto from the clock input terminal 1 and, on the basis of the count, outputs the control signals, which are for varying the phase of the output clock signal, and outputs the signals to the phase interpolator 4.

In the present embodiment, the up signal 6, which advances the phase of the output clock signal a prescribed amount, and the down signal 7, which retards the phase of the output clock signal a prescribed amount, preferably are used as the control signals. On the basis of the result of counting the input clock signal, the controller 3 activates the up signal and/or the down signal a prescribed number of times every prescribed number of periods predetermined with regard to the input clock signal and supplies the signal/signals to the phase interpolator 4.

As a result, the phase of the output clock signal from the phase interpolator 4 varies with time and the output clock signal is frequency modulated within a prescribed frequency range.

In accordance with the present invention, a step phase error in the clock output prevailing when the up signal or down signal is input to the phase interpolator is decided by resolution (period/N) and therefore a smooth spread spectrum clock (SSC) can be generated by setting N appropriately. A more detailed description of preferred embodiments will now be given.

FIG. 1 is a block diagram illustrating the configuration of a first preferred embodiment of a spread spectrum clock generating apparatus according to the present invention. As shown in FIG. 1, the apparatus includes the controller 3 (referred to also as an "SSC controller") and the phase interpolator 4. A clock signal that has entered from the clock input terminal 1 is supplied in common to the controller 3 and phase interpolator 4.

The controller 3 outputs a timing signal 5 that is generated based upon the input clock signal. Further, the controller 3 counts the input clock signal and, on the basis of the count, performs control to output the up signal 6, which instructs the phase interpolator 4 to advance the phase of the output clock signal thereof a prescribed amount, and/or the down signal 7, which instructs the phase interpolator 4 to retard the phase of the output clock signal thereof a prescribed amount. More specifically, on the basis of the result of counting the input clock signal, the controller 3 performs control to output the up signal 6/down signal 7 a prescribed number of times at every interval that is a prescribed multiple of one period of the input clock signal. The structure and operation of the controller 3 will be described in detail later.

The phase interpolator 4 advances or retards the phase of the output clock signal based upon the polarity of the up signal 6 or down signal 7 from the controller 3 at a prescribed timing decided by the timing signal 5 (the timing of the rising or falling edge of the timing signal 5). In the example of FIG. 1, a single-phase clock signal is input to the phase interpolator 4 in order to simplify the description of the invention. However, the clock is not limited to a single-phase clock and it is permissible to use a 2-phase clock or multiphase clock such as a 4- or 8-phase clock as a matter of course.

In this embodiment, the units in which the phase of the output clock signal from the phase interpolator 4 is advanced or retarded are decided by the resolution of the phase interpolator 4. In the description that follows, it will be assumed that the resolution of the phase interpolator 4 is $T_0/N$, where $T_0$ represents one period of the clock signal input to the clock input terminal 1, and N represents a predetermined positive integer.

The phase interpolator 4 delays the phase of the output clock signal a prescribed amount at the rising edge of the timing signal 5 from the controller 3 when the down signal 7 is at logic "1". At this time the amount of phase delayed by the phase interpolator 4 is assumed to be, e.g., the unit resolution $T_0/N$, as a result of which the period of the output clock signal becomes $T_0+(1/N) \times T_0$.

Further, the phase interpolator 4 advances the phase of the output clock signal a prescribed amount at the rising edge of the timing signal 5 from the controller 3 when the up signal 6 is at logic "1". At this time the amount of phase advanced by the phase interpolator 4 is assumed to be, e.g., the unit resolution $T_0/N$, as a result of which the period of the output clock signal becomes $T_0-(1/N) \times T_0$.

In accordance with this embodiment, the period of the output clock signal from the phase interpolator 4 is thus varied by the up signal 6 and down signal 7 from the controller 3. That is, the frequency of the output clock signal is modulated and a spread spectrum clock is generated. A specific example of generation of a spread spectrum clock will be described in detail.

Let $f_0$ represent the frequency of the clock signal that enters from the clock input terminal 1, and let $T_0$ represent one period. The frequency $f_0$ and period $T_0$ are related as indicated by the following equation:

$$f_0 = 1/T_0 \quad (1)$$

Let k (where k is a predetermined positive integer) represent a number of periods of a clock serving as a reference (e.g., number of cycles of the input clock signal or clock signal obtained by frequency-dividing the same). Let n represent the difference between the number of down signals 7, which retard the phase of the output clock signal, and the number of up signals 6, which advance the phase of the output clock signal, in a period of time equivalent to $k \times T_0$ [i.e., the difference between the number of times down signal 7 is logic "1"(in the activated state) and the number of times the up signal 6 is logic "1"(in the activated state)]. The difference is represented by Equation (2) below.

$$n = (\text{number of down signals}) - (\text{number of up signals}) \quad (2)$$

If we let $T_{<average>}$ represent the average period of the output clock signal in the number k of periods serving as the reference when the difference between the number of down signals 7 and number of up signals 6 in the reference number k of periods is n, then the following equation will hold:

$$k \times T_{<average>} = k \times T_0 + (n/N) \times T_0$$

In view of the fact that average frequency $f_{<average>}$ in the number k of periods is equal to $1/T_{<average>}, f_{<average>}$ is given by Equation (3) below.

$$f_{<average>} = k / [k \times T_0 + (n/N) \times T_0]$$
$$= (1/T_0) \times (k \times N) / (k \times N + n)$$

where the value of n satisfies the relation $-k \leq n \leq k$.

The following holds in accordance with Equation (3) above:
$f_{<average>}$ is smaller than $f_0$ (=$1/T_0$) if n is a positive value;
$f_{<average>}$ is greater than $f_0$ if n is a negative value; and
$f_{<average>} = f_0$ if n is zero.

The controller 3 controls n. That is, on the basis of the input clock signal, the controller 3 performs control to increase or decrease n (the difference between the number of down signals 7 and up signals 6 in the number k of periods serving as the reference) within the range $-k \leq n \leq k$ with the passage of time.

If we let n(t) represent the number of n's (differences between the number of down signals 7 and up signals 6) in a past reference number k of periods at time t, then n(t) will be the average number of n's in the reference number k of periods. If we let f(t) represent the average frequency at time t, then f(t) can be expressed by Equation (4) below.

$$f(t) = (1/T_0) \times (k \times N)/k \times N + n(t)] \quad (4)$$

Equation (4) above indicates that f(t) has been frequency-modulated. Described below is an example in which n(t) is increased or decreased every reference number k of periods and makes a round trip over $-k \leq n(t) \leq k$, where we assume that the frequency ($1/T_0$) is 100 MHz, that the resolution N of the phase interpolator 4 is 64 and that the reference number k of periods is 100.

From Equation (4) above, frequency modulation is a minimum of 98.46 MHz and a maximum of 101.59 MHz.

As an example of control of n(t) in controller 3, n(t) is decremented by, e.g., one from an initial value of, e.g., zero every reference number k of periods, and at a time $k \times k \times T_0$ (100 µs), n(t)=$-k$ is attained and f(t) attains the maximum value of 101.59 MHz. Then, n(t) is incremented from this value by, e.g., one every reference number k of periods, and at a time $3 \times k \times k \times T_0$ (300 µs), n(t)=$+k$ is attained and f(t) attains the minimum value of 98.46 MHz. Then, n(t) is decremented from this value by, e.g., one every reference number k of periods, and at a time $4 \times k \times k \times T_0$ (400 µs), n(t)=0 is attained. The above-described sequence constitutes a single period Tfm of frequency modulation and the sequence is repeated every period Tfm.

Accordingly, one period Tfm of frequency modulation is found from Equation (5) below.

$$Tfm = 4 \times k \times k \times T_0 \quad (5)$$

In accordance with Equation (5) above, the period Tfm is 400 µs and the output clock signal from output terminal 2 is a spread spectrum clock that has been frequency-modulated at 2.5 kHz.

Figure 2:
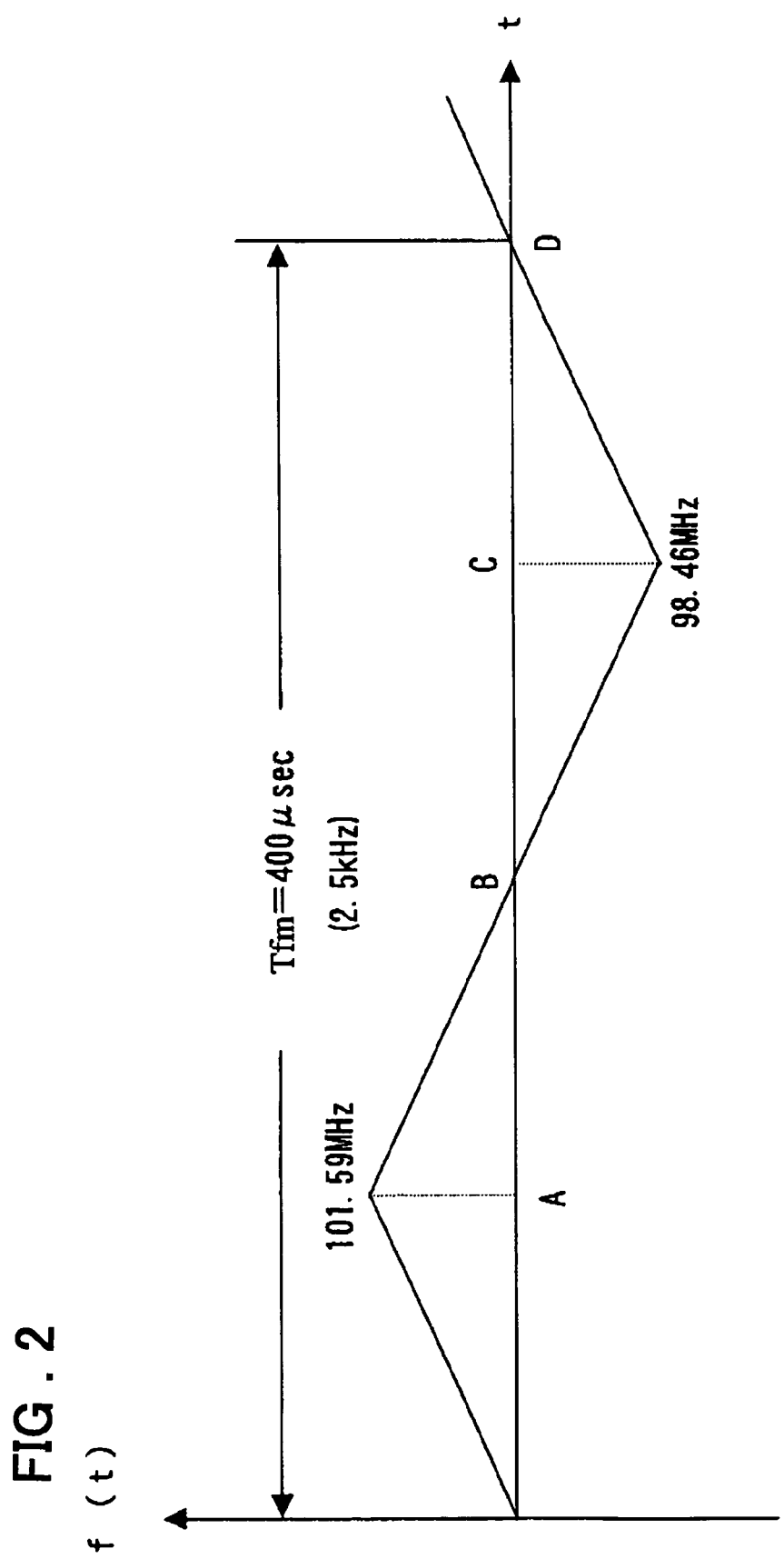
FIG. 2 is a diagram illustrating an example of frequency modulation in a time domain according to an embodiment of the present invention.

FIG. 2 is a diagram illustrating the results of frequency modulation along the time axis. Time is plotted along the horizontal axis and average frequency along the vertical axis. It will be understood also from FIG. 2 that the signal is frequency-modulated at 2.5 kHz (period Tfm=400 μs). In FIG. 2, points in time A, B, C and D are 100 μs (=k×k×T$_0$), 200 μs (=2×k×k×T$_0$), 300 μs (=3×k×k×T$_0$) and 400 μs (=4×k×k×T$_0$). The average frequencies per reference number k of periods at these times are 101.59 MHz, 100 MHz, 98.46 MHz and 100 MHz, respectively.

In this embodiment, the timing signal 5 and input clock signal are described as being of the same frequency. When the clock frequency rises, the operating frequency of the controller 3 also rises. It is therefore necessary to provide a pre-frequency divider (not shown in FIG. 1, but refer to a pre-frequency divider 21 in FIG. 3, described later) at the clock input of the controller to thereby suppress the operating frequency. If the frequency dividing ratio of the pre-frequency divider is m, then the timing signal 5, up signal 6 and down signal 7 will each be frequency-divided thereby to enable the operating frequency to be reduced.

In the arrangement having the pre-frequency divider, Equations (4) and (5) above can be obtained by substituting m×T$_0$ for T$_0$ into these equations. If the pre-frequency dividing ratio m is 4 and f$_0$ is 400 MHz, then the degree of modulation will be the same and a spread spectrum clock having a modulation frequency of 400 MHz can be achieved.

Figure 3:
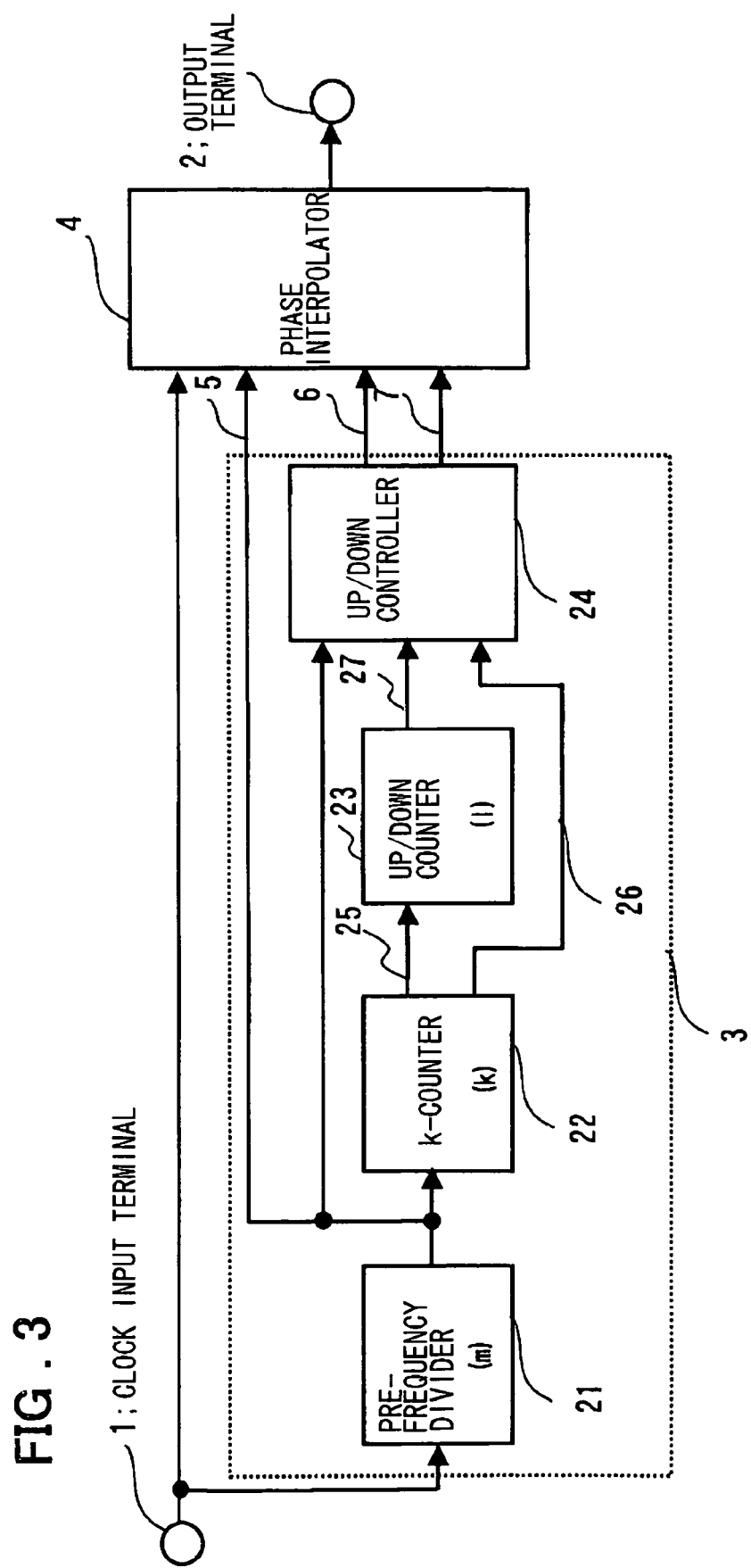
FIG. 3 is a block diagram illustrating a second embodiment of the present invention.

A second embodiment of the present invention will be described next. FIG. 3 is a block diagram illustrating the configuration of the second embodiment. One example of the configuration of the controller of FIG. 1 is illustrated in FIG. 3, in which components identical with or equivalent to those shown in FIG. 1 are designated by like reference characters. The circuit configuration and operation of the controller 3 will be described below.

As shown in FIG. 3, the controller 3 includes a pre-frequency divider 21, a k-counter 22, an up/down counter 23 and an up/down controller 24. Each of these components will now be described.

The input clock signal from the clock input terminal 1 is supplied to the pre-frequency divider 21, which proceeds to frequency-divide the input clock signal in accordance with the frequency dividing ratio m and output the frequency-divided clock signal as the timing signal 5. The timing signal 5 output from the pre-frequency divider 21 is supplied to the k-counter 22, which is for counting the number k of periods serving as the reference, and to the phase interpolator 4 and up/down controller 24.

The k-counter 22 outputs a k-count output signal 25 whenever k-number of the timing signals 5 are counted. Here k corresponds to the reference number k of periods mentioned above. In the present embodiment, the reference number k of periods corresponds to k cycles of the timing signal 5, which is the frequency-divided clock signal. The k-count output signal 25 from the k-counter 22 is supplied to the up/down counter 23. When the k-counter 22 outputs the k-count output signal 25, the value of the count in the counter is cleared to zero and the counter again starts counting the timing signal 5. A k-count output signal 26 is supplied to the up/down controller 24.

The up/down counter 23 receives the k-count output signal 25 and counts this signal up and down repeatedly. That is, the up/down counter 23 performs the following operation repeatedly: The counter 23 receives the k-count output signal 25 and counts up from the initial value (e.g., zero) of the counter successively. If the count reaches a prescribed value 1, then the counter 23 counts down from the input of the next k-count output signal 25 successively in the manner 1−1, 1−2, . . . .. If the count reaches −1, then the counter counts up from the next input of the k-count output signal 25 in the manner −1+1, −1+2, . . . , 0, 1, 2 until the prescribed value 1 is attained. A count value 27 from the up/down counter 23 is input to the up/down controller 24.

The up/down controller 24 outputs the up signal 6 or down signal 7 to the phase interpolator 4 in sync with the timing signal 5 from the pre-frequency divider 21 based upon a combination of the k-count output signal 26 and count value 27 input thereto.

On the basis of the up signal 6 or down signal 7 from the controller 3, the phase interpolator 4 delivers the output clock signal, which is the result of frequency modulating the input clock signal, as the spread spectrum clock signal.

In FIG. 3, the pre-frequency divider 21 converts the operating period of the controller 3 from the period T$_0$ of the input clock signal to m×T$_0$. The k-counter 22, which receives the timing signal 5 that is the frequency-divided clock signal from the pre-frequency divider 21, counts the reference number k of periods. Further, the up/down counter 23 performs the up-count or down-count operation based upon the k-count output signal 25, which is output from the k-counter 22, every cycle k×m×T$_0$.

In this embodiment, it is assumed that the number of counts of the up/down counter 23 is 1. This differs from the value in regard to the up/down counter 23 in the first embodiment. In the first embodiment, which has been described with reference to FIGS. 1 and 2, the number of counts of the up/down counter 23 is assumed to be k (i.e., a value identical with the number k of periods serving as the reference).

In the present embodiment, the degree of frequency modulation of the output clock signal is obtained by replacing the range of fluctuation of n(t) in Equation (4) with −1≦n(t)≦1.

A modulation period Tfm2 of frequency in this embodiment is found from Equation (6) below.

$$Tfm2 = 4 \times k \times 1 \times m \times T_0 \quad (6)$$

Here k represents the number of periods, m the frequency dividing ratio, 1 the number of counts of the up/down counter 23 and T$_0$ one period of the input clock.

In this embodiment, the controller 3 controls the value of the up signal 6 or down signal 7, which is supplied to the phase interpolator 4, and therefore controls n(t) in a manner similar to that of the first embodiment. The controller performs sequence control in units of the period Tfm2. An example of this sequence control is as follows: First, n(t) is decremented from n(t)=0 by, e.g., one every reference number m×k of periods, and at a time k×1×m×T$_0$, n(t)=−1 is attained [f(t)=101.59 MHz]. Then, n(t) is incremented by, e.g., one every reference number m×k of periods and at a time 3×k×1×m×T$_0$, n(t)=+1 is attained [f(t)=98.46 MHz]. Then, n(t) is decremented by, e.g., one every reference number m×k of periods and at a time 4×k×1×m×T$_0$, n(t)=0 is attained. In the controller 3 of this embodiment, "when the conditions are 1=k and m=1," the transition of frequency modulation over time agrees with that of the example shown in FIG. 2.

In accordance with this embodiment, the degree of frequency modulation and the period of modulation can be set optimally by changing the count values of k and 1 appropriately.

Thus, in accordance with this embodiment as described above, a spread spectrum clock generating apparatus is implemented using the phase interpolator 4, which has a resolution of N, and the controller 3. Since the step phase error of the output clock signal when the up signal 6 or down signal 7 is supplied to the phase interpolator 4 is decided by T$_0$/N, it is possible to generate a smooth spread spectrum clock signal. Further, since a clock obtained by frequency dividing the input clock is used in the controller 3, the operating frequency of the controller 3 can be kept down and it is possible to support a high-speed clock.

A third embodiment of the present invention will be described next. In the first and second embodiments, frequency modulation is implemented by a combination of the up signal 6 and down signal 7 supplied to the phase interpolator 4. In the third embodiment, however, frequency modulation is achieved using only the down signal 7. First an overview of an apparatus to which the third embodiment of the invention is applied will be given, then the configuration of the third embodiment and the frequency modulating operation thereof will be described.

Operating frequencies have risen in recent years and bit-to-bit skew specifications in parallel interface buses have become more stringent. If a large number of buses are connected in cascade, bit-to-bit skew of the buses falls out of specs and begins to impede communication. For example, with an IDE interface (also referred to as an "ATA interface") that connects a hard disk and a CPU, parallel interfaces up to ATA 100 have been used. Furthermore, though a high-speed ATA 133 also has been studied, the development of serial interfaces in which bit skew fundamentally does not occur has become the focus of attention. SATA (Serial ATA) is a first-generation serial-interface standard in which the communication speed is 1.5 Gbps. In order to exclude continuous high or low levels, communication speed becomes 120 MBbs owing to use of an 8B10B converting circuit. This speed is higher than the 100 MBps of the ATA 100. Further, a plan to double communication speed every two years has been announced as a development roadmap. This is seen as being an interface standard that will readily allow high communication speeds to be achieved in the future. Since SATA is an interface used in personal computers or servers employed widely in homes and offices, EMI countermeasures are incorporated in the specifications.

A standard referred to as "Downspread" aims to reduce the power peak of clock frequency by about 7 dB by applying frequency modulation of −5000 ppm to the clock center frequency from a modulation frequency of 30 kHz to 33 kHz.

Figure 4:
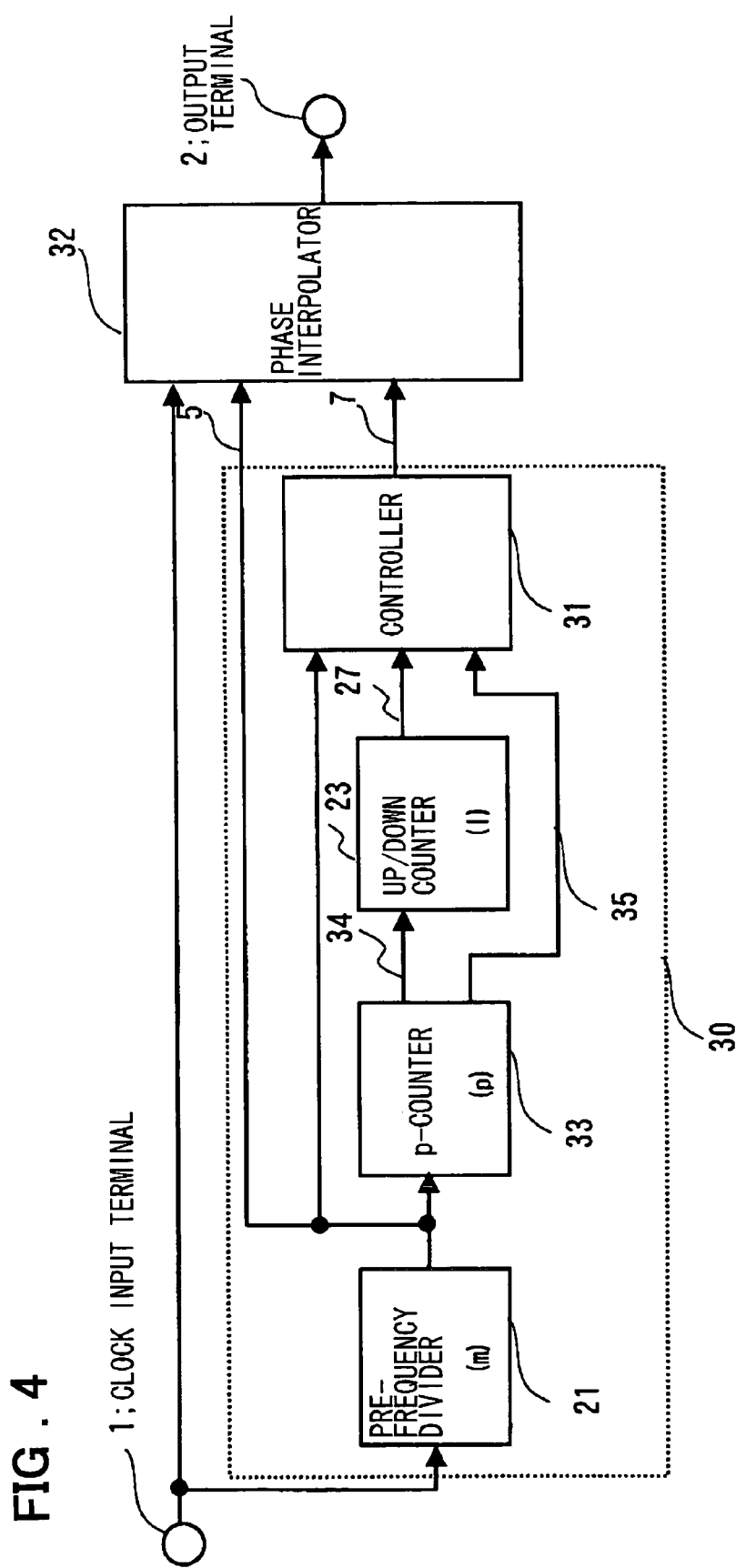
FIG. 4 is a block diagram illustrating a third embodiment of the present invention.

The clock generating apparatus of the third embodiment of the present invention is ideal for application to a system in which spectrum spreading is in the down direction. FIG. 4 is a block diagram illustrating the configuration of the third embodiment, in which components identical with or equivalent to those shown in FIG. 3 are designated by like reference characters. As shown in FIG. 4, a controller 30 and a phase interpolator 32 differ from the controller 3 and interpolator 4 of the second embodiment shown in FIG. 3. Primarily, these differences from the second embodiment will be described below.

As shown in FIG. 4, in this embodiment the controller 30 outputs only the down signal 7 as the output signal to the phase interpolator 32.

In this embodiment, a number p of periods serving as a reference is defined in conformity with a number of clock periods serving as the unit of frequency up/down control. In the first and second embodiments, on the other hand, the number k of periods serving as the reference is made to conform to half the number of clock periods serving as the unit of frequency up/down control. Further, in this embodiment, n [see Equation (2) above] is assumed to satisfy the relation $0 \leq n \leq 2 \times 1$ in an interval $(m \times p \times T_0)$ decided by the reference number p of periods, where n is the difference between the down signal 7 output from the controller 30 to the phase interpolator 32 and an up signal (where the number of times the up signal is output is zero). By contrast, n is set to $-k \leq n \leq k$ in the first embodiment and to $-1 \leq n \leq 1$ in the second embodiment.

In the present embodiment, the phase interpolator 32 receives the down signal 7 output from the controller 30 and delivers the output clock signal whose phase has been adjusted in accordance with the down signal 7.

The basic configuration and operation of the controller 30 according to this embodiment are substantially similar to those of the controller 3 according to the second embodiment, though the controller 30 is adapted so as to output the down signal 7 only. The controller 30 includes the pre-frequency divider 21, a p-counter 33 for counting the timing signal 5 from the pre-frequency divider 21, the up/down counter 23 and a controller (down controller) 31. The timing signal 5 from the pre-frequency divider 21 (frequency dividing ratio=m), the count value 27 from the up/down counter 23 and a count value 35 from the p-counter 33 are supplied to the controller 31, which outputs the down signal 7 at a timing decided by the timing signal 5.

When the maximum number of up signals 6 is output [n(t)=−1] in the second embodiment illustrated in FIG. 3, no up signal is output in this embodiment.

Further, when the up signal 6 and down signal 7 do not appear [n(t)=0] in the second embodiment illustrated in FIG. 3, one down signal 7 from the controller 31 is output in the reference number m×p of periods in the present embodiment.

The present embodiment is such that when the maximum number of down signals 7 is output (time E in FIG. 5), the number of down signals 7 that is output from the controller 31 in the reference number m×p of periods is 2×1.

The present embodiment will now be described taking specific design values as an example.

Here m=4 is adopted as the frequency dividing ratio of the pre-frequency divider 21. The larger the frequency dividing ratio m, the more the operating speed of the p-counter 33, up/down counter 23 and controller 31 can be reduced. If the frequency dividing ratio m is made too large, however, phase modulation will become too coarse. The frequency modulation degree and the frequency dividing ratio m can be expressed by Equation (7) below. It should be noted that Equation (7) holds on the assumption that the down signal 7 continues to be output at the time of maximum frequency modulation.

$$\text{degree of frequency modulation} = 1/(m \times N) \quad (7)$$

If the phase interpolator 32 used has a resolution N of 64, then the frequency dividing ratio m and degree of frequency modulation will be as indicated in Table 1 below.

| FREQUENCY DIVIDING RATIO (m) | DEGREE OF FREQUENCY MODULATION |
| --- | --- |
| 3 | 0.0052 |
| 4 | 0.0039 |
| 5 | 0.00313 |

In other words, with frequency dividing ratio m=4 within specs, the maximum degree of frequency modulation (0.0039) is obtained.

The frequency dividing ratio m of the pre-frequency divider 21, the reference number p of periods, the count 1 of the projection region WE and the modulation frequency are related by the inequality of Expression (8) below, in which 0.033 and 0.03 represent the modulation frequencies 33 kHz and 30 kHz, respectively, in units of MHz, and 1500 represents 1.5 GHz in units of MHz.

$$1500/0.033 \leq 2 \times m \times p \times 1 \leq 1500/0.03 \qquad (8)$$

Expression (8) will now be described. If we assume that one clock period is $T_0$ [$=1/(1500\times10^6)$], then the modulation period Tfm3 of this embodiment will be given by Equation (9) below.

$$Tfm3 = 2 \times m \times p \times 1 \times T_0 \qquad (9)$$

Accordingly, Expression (8) is derived from the requirement that one modulation period Tfm3 is equal to or greater than $1/(33\times10^3)$ and equal to or less than $1/(30\times10^3)$.

In this embodiment, the controller 31 controls the value of the down signal 7 supplied to the phase interpolator 32 and therefore controls n(t). The controller performs sequence control in units of the period Tfm3. An example of this sequence control is as follows: First, n(t) is incremented from n(t)=0 (e.g., see time F in FIG. 5) successively every reference number m×p of periods, and at a time m×p×1×$T_0$ (e.g., see time E in FIG. 5), n(t)=2×1 is attained. Then, n(t) is decremented successively every reference number m×p of periods and at a time 2×m×p×1×$T_0$ (e.g., see time G in FIG. 5), n(t)=0 is attained.

If we solve Expression (8), assuming that p=1 holds for the sake of simplicity, then, with m=4, we have $$75.38 \leq p=1 \leq 79.05 \qquad (10)$$

If we adopt p=1=77 from among the p and 1 that satisfy the inequality (10), then the modulation frequency will be 31.62 kHz.

Figure 5:
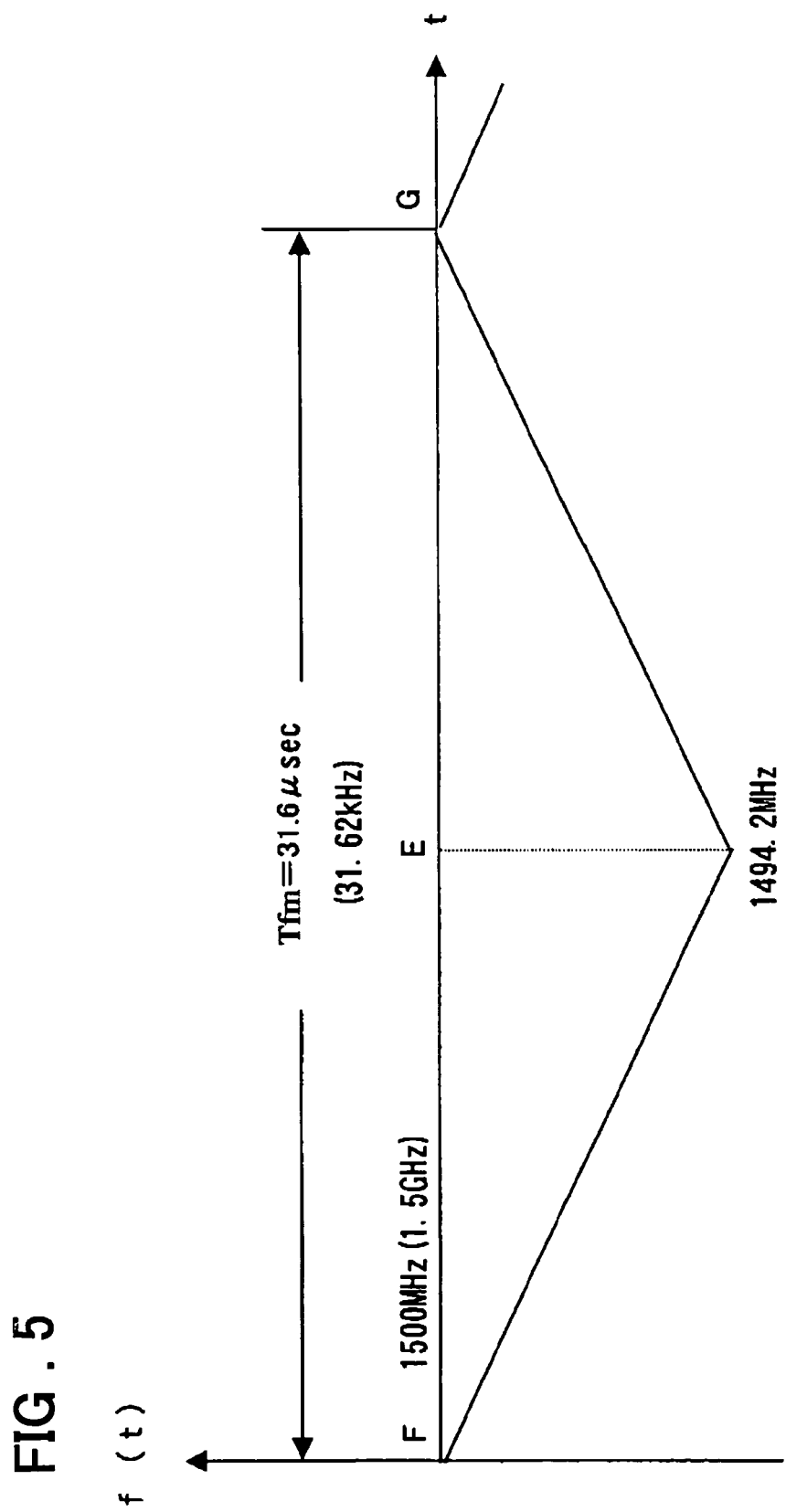
FIG. 5 is a diagram illustrating an example of frequency modulation in a time domain according to the third embodiment.

FIG. 5 is a diagram illustrating an example of frequency modulation in a time domain in a case where m=4, p=1=77 hold according to this embodiment. As shown in FIG. 5, the waveform (a triangular wave) in which the maximum modulation frequency has been set to 1.5 GHz (=1/$T_0$) is obtained. The minimum modulation frequency (time E in FIG. 5) becomes 1494.2 MHz.

In a modification of the third embodiment, the controller 31 of FIG. 4 may be composed by an up controller which outputs only the up signal, rather than the down signal 7, as the control signal that is output to the phase interpolator 32. In this modification, the pre-frequency divider 21, p-counter 33 and up/down counter 23 are similar to those shown in FIG. 4. The phase interpolator 32 receives the up signal output from the controller 31 and produces an output clock signal the phase of which has been adjusted in accordance with the up signal.

Figure 6:
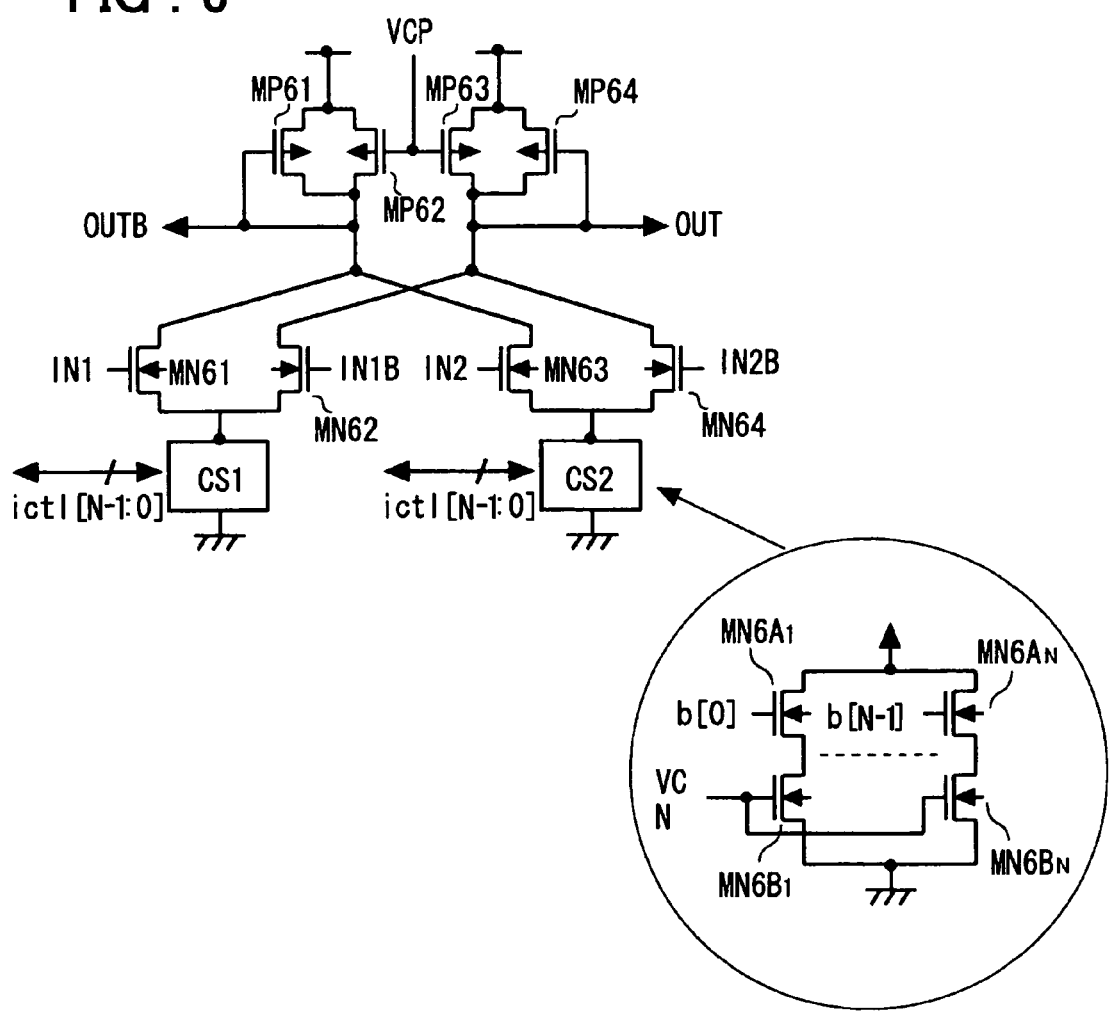
FIG. 6 is a diagram illustrating an example of a phase interpolator.

In the above embodiment, the phase interpolator 4 employs any well-known circuitry. For example, a phase interpolator having a structure illustrated in FIG. 6 may be used (see S. Sidiropoulos and Mark Horowitz et. al., "A Semi-Digital DLL with Unlimited Phase Shift Capability and 0.08-400 MHz Operating Range," ISSCC 1997 pp. 332-333). A 4-phase clock from the clock input terminal 1 of FIG. 1 may be supplied to inputs IN1, INB1, IN2 and IN2B in FIG. 6. As shown in FIG. 6, the phase interpolator includes NMOS transistors MN61, MN62 and NMOS transistors MN63, MN64. The NMOS transistors MN61 and MN62 constitute a first differential pair and have their sources tied together and connected to a first constant-current source CS1, receive respective ones of clocks IN1 and IN1B differentially at their gates and output respective ones of a pair of outputs thereof to one end of a first load (the common drain of parallel-connected PMOS transistors MP61, and MP62) and to one end of a second load (the common drain of parallel-connected PMOS transistors MP63 and MP64). The NMOS transistors MN63 and MN64 constitute a second differential pair and have their sources tied together and connected to a second constant-current source CS2, receive respective ones of clocks IN2 and IN2B differentially at their gates and have respective ones of a pair of outputs thereof connected to one end of the first load (the common drain of the PMOS transistors MP61 and MP62) and to one end of the second load (the common drain of the PMOS transistors MP63 and MP64). Outputs OUT and OUTB of phases that are a weighted sum of the two input clocks are delivered from a commonly connected output pair of the first and second differential pairs. This phase interpolator is such that digital weighting codes ict1 (N-number of bits b[0] to b[N−1] in conformity with a phase resolution N, where 16 bits b[0] to b[15] are adopted in the above-mentioned reference) are supplied to the first and second constant-current sources CS1 and CS2. The current values of the first and second constant-current sources CS1 and CS2 can be varied (the number of constant-current sources $MN6B_1$ to $MN6B_N$ is selected by turning ON and OFF NMOS transistors $MN6A_1$ to $MN6A_N$ having N-number of bits b[0] to b[N−1] supplied to the gate terminals thereof) so that a conversion is made to the phase of the output clock. In FIG. 6, it is assumed that the current values of the constant-current sources $MN6B_1$ to $MN6B_N$ are the same. The phase interpolator 4 is adapted so as to generate and output the digital weighting code ict1 (thermometer code) from the difference n (a binary value) between the number of down signals 7 and number of up signals 6, which were output from the controller 3 during the past number k of periods serving as the reference, at a timing decided by the timing signal 5.

In FIG. 6, the active loads MP61, MP62 and MP63, MP64 may be replaced by resistors.

Figure 7:
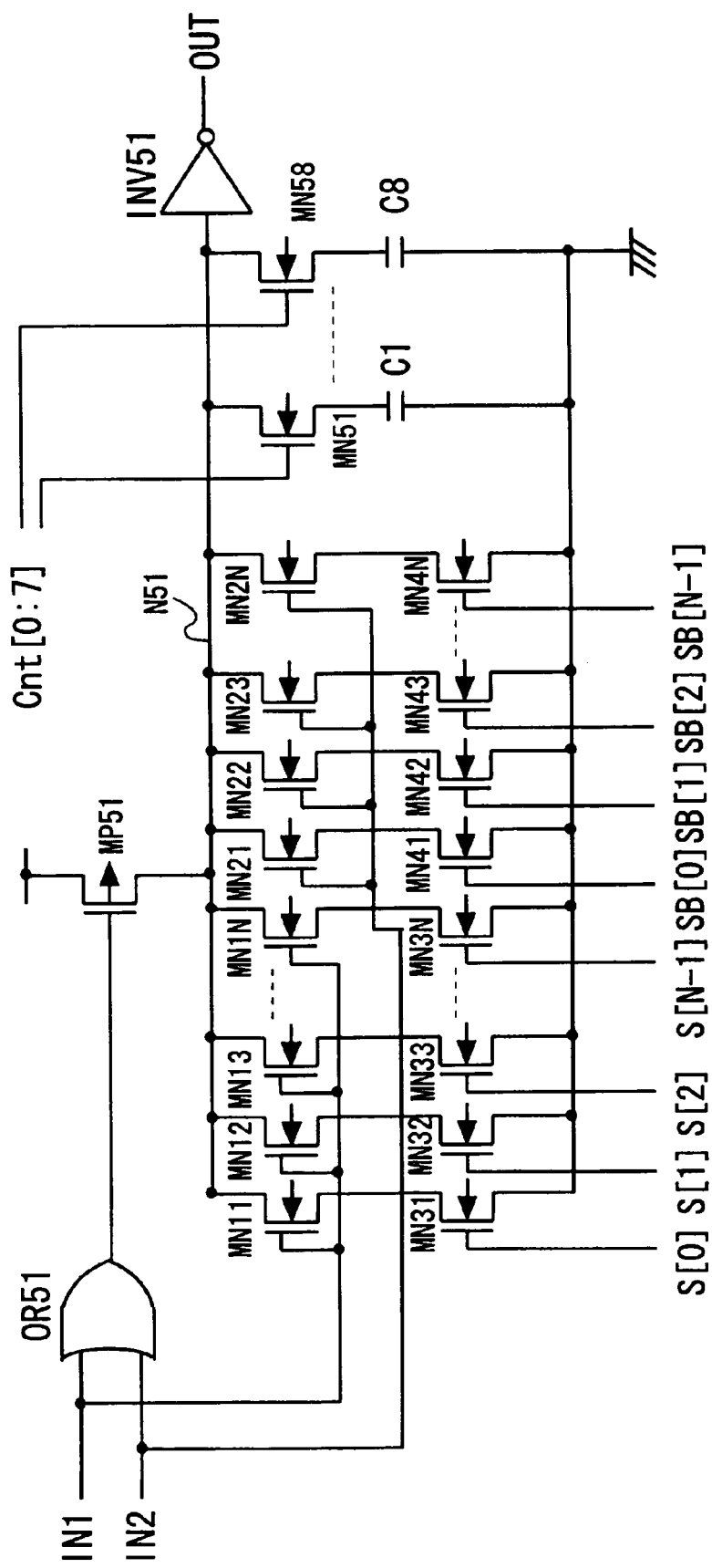
FIG. 7 is a diagram illustrating another example of a phase interpolator.
Figure 8:
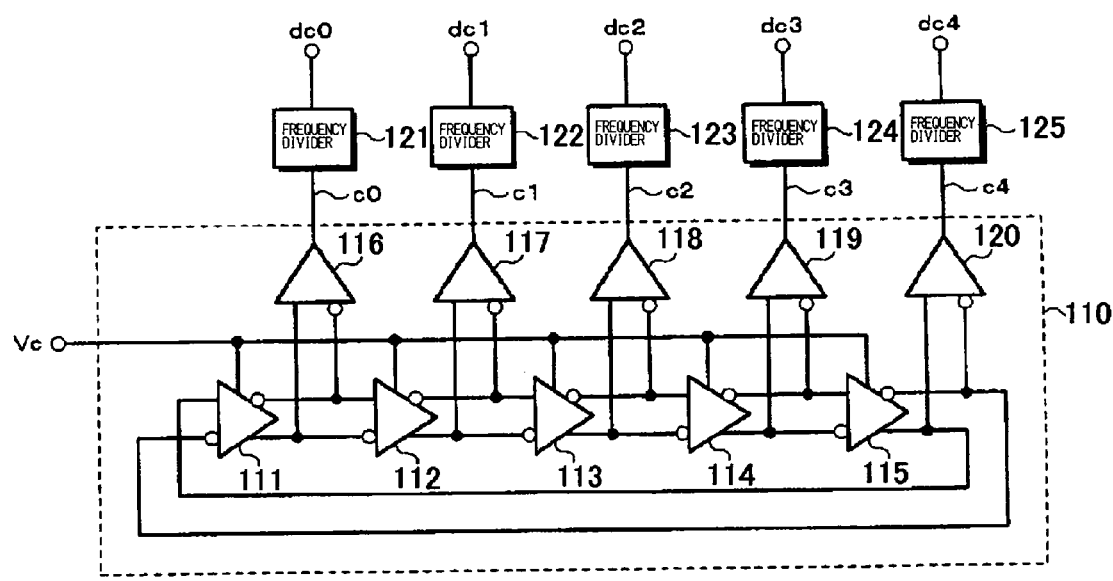
FIG. 8 is a diagram illustrating the structure of a clock generator for generating a 5-phase clock using a ring oscillator according to the prior art.

Alternatively, an arrangement disclosed in FIG. 6, etc., of the specification of Japanese Patent Kokai Publication No. JP-P2002-190724A (pages 8 and 9, FIG. 6) may be used as the phase interpolator 4. One example of this is illustrated in FIG. 7. The phase interpolator illustrated in FIG. 7 delivers an output clock from an output terminal OUT. The output clock signal has a delay corresponding to an amount of phase obtained by internally dividing the phase difference of signals applied to inputs IN1 and IN2 with an internal division ratio decided by control signals S[0] to S[N−1] (SB[0] to SB[N−1] are signals obtained by inverting S[0] to S[N−1]). By assuming that the internal dividing ratio of the phase difference between the rising edges of the inputs IN1 and IN2 is x:(1−x), adopting, e.g., x=0 and x=1 as the upper and lower limits, respectively, of the range of frequency fluctuation of the output clock and variably setting the internal division ratio x over the range of 0 to 1, the phase of the output clock is varied and the frequency modulated. A 2-phase clock comprising a signal obtained by frequency dividing a single-phase clock (the input clock from clock input terminal 1 in FIG. 1) by 2 and a signal that is the inverse of this signal may be supplied to the inputs IN1 and IN2. (In this case, the phase difference between the inputs IN1 and IN2 is the period $T_0$ of the input clock.)

An overview of the circuit operation of the phase interpolator shown in FIG. 7 will now be described. When the input signals IN1 and IN2 are at the low level, a node N51 is charged via a PMOS transistor MP51 having a gate which receives the output of an OR gate 51. NMOS transistors MN31 to MN3N have the control signals S[0] to S[N−1], respectively, applied to their gates. At the rising edge of the input signal IN1, charge stored in the capacitor at node N51 is partially discharged via the paths of n-number of these NMOS transistors turned ON in response to their control signals attaining the high level. NMOS transistors MN41 to MN4N have the control signals SB[0] to SB[N−1], respectively, applied to their gates. At the rising edge of the input signal IN2, which lags behind the rising edge of input signal IN1, charge stored in the capacitor at node N51 is discharged via a total of N-number of paths of paths through (N-n)-number of these NMOS transistors turned ON in response to their control signals attaining the high level and paths through n-number of ON NMOS transistors among the NMOS transistors MN31 to MN3N. When the voltage at node N51 falls below a threshold value, the output of an inverter INV51 rises from the low to the high level. As a result, the phase of the output clock can be set variably in units of T/N, where T represents the phase difference between the inputs IN1 and IN2 and N is the divisor. It may be so arranged that the phase interpolator 4 generates the control signals S[0] to S[N−1] (thermometer codes) from the difference between the numbers of down signals 7 and up signals 6 that were output during the past number k of periods serving as the reference, at a timing decided by the timing signal 5 (see FIG. 1), with the output being held until the next timing signal 5 is output.

Though the present invention has been described in accordance with the foregoing embodiments, the invention is not limited to this embodiment and it goes without saying that the invention covers various modifications and changes that would be obvious to those skilled in the art within the scope of the claims.

The meritorious effects of the present invention are summarized as follows.

Thus, in accordance with the present invention, as described above, a spread spectrum clock generator can be implemented using a phase interpolator and a control circuit (controller) without relying upon a pulse-swallow frequency divider and VCO, etc.

Further, in accordance with the present invention, a step phase error in a clock output prevailing when the up signal or down signal is supplied to a phase interpolator is decided by the phase resolution of the phase interpolator. As a result, a smooth spread spectrum clock can be generated.

In accordance with the present invention, the arrangement adopted is one in which a control circuit is operated by a frequency-divided clock signal that is the result of frequency dividing an input clock, thereby reducing the operating frequency of the control circuit. This makes it possible to realize frequency modulation of clocks having higher frequencies.

As many apparently widely different embodiments of the present invention can be made without departing from the spirit and scope thereof, it is to be understood that the invention is not limited to the specific embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A spread spectrum clock generating apparatus comprising:

a phase interpolator receiving an input clock signal and a control signal, varying a phase of an output clock signal in accordance with the control signal and outputting the resultant output clock signal; and a control circuit receiving and counting the input clock signal, generating the control signal, which is for varying the phase of the output clock signal, based upon a count result, such that a frequency of the output clock makes a round trip over a predetermined frequency range, and supplying the so generated control signal to the phase interpolator, the output clock signal being frequency-modulated, the input clock signal not being derived from the output clock signal, wherein the modulated frequency of the output clock signal is obtained by taking an average (arithmetic mean) of k cycles of the input clock signal, where k comprises a predetermined positive integer, and wherein said control circuit includes a circuit for generating the control signal in such a manner that said frequency of the output clock signal makes said round trip over said frequency range, which frequency range is stipulated by predetermined first and second frequencies of mutually different frequencies, in an interval that is a prescribed multiple of a period of the input clock signal, and supplying the generated control signal to said phase interpolator.

2. The apparatus according to claim 1, wherein the control signal supplied from the control circuit to the phase interpolator includes an up signal that advances the phase of the output clock signal and/or a down signal that retards the phase of the output clock signal.

3. The apparatus according to claim 1, wherein the control signal supplied from the control circuit to the phase interpolator includes:

an up signal that advances the phase of the output clock signal a prescribed amount; and a down signal that retards the phase of the output clock signal a prescribed amount; and wherein said control circuit includes a circuit for exercising control so as to activate, a prescribed number of times, the up signal and/or down signal based upon the count result every prescribed number of periods predetermined with regard to the input clock signal, and supply the activated signal to said phase interpolator.

4. The apparatus according to claim 1, wherein the control signal supplied from said control circuit to said phase interpolator includes a down signal that retards the phase of the output clock signal a prescribed amount; and wherein said control circuit includes a circuit for exercising control so as to activate, a prescribed number of times, the down signal based upon the count every prescribed number of periods predetermined with regard to the input clock signal, and supply the activated signal to said phase interpolator.

5. The apparatus according to claim 1, wherein the control signal supplied from said control circuit to said phase interpolator includes an up signal that advances the phase of the output clock signal a prescribed amount; and wherein said control circuit includes a circuit for exercising control so as to activate, a prescribed number of times, the up signal based upon the count every prescribed number of periods predetermined with regard to the input clock signal, and supply the activated signal to said phase interpolator.

6. The apparatus according to claim 1, wherein said phase interpolator includes a circuit for retarding or advancing the phase of the output clock signal based upon the control signal, with a prescribed resolution serving as a unit of the period of the input clock signal.

7. The apparatus according to claim 6, wherein said resolution of said phase interpolator comprises $T_0/N$, where $T_0$ represents one period of the clock signal input, and N represents a predetermined positive integer.

8. A serial interface device having the spread spectrum clock generating apparatus as set forth in claim 1.

9. The apparatus according to claim 1, wherein the apparatus is devoid of pulse-swallow frequency dividers.

10. The apparatus according to claim 1, wherein the apparatus is devoid of voltage-controlled oscillators.

11. The apparatus according to claim 1, wherein the output clock signal comprises a smooth spread-spectrum clock.

12. The apparatus according to claim 1, wherein the input clock signal comprises a multiphase clock.

13. The apparatus according to claim 1, wherein a duration of said round trip comprises a predetermined multiple of a period of the input clock signal.

14. A spread spectrum clock generating apparatus comprising:
   a phase interpolator receiving an input clock signal and a control signal, varying a phase of an output clock signal in accordance with the control signal and outputting the resultant output clock signal; and
   a control circuit receiving and counting the input clock signal, generating the control signal, which is for varying the phase of the output clock signal, based upon a count result, such that a frequency of the output clock makes a round trip over a predetermined frequency range, and supplying the so generated control signal to the phase interpolator,
   the output clock signal being frequency-modulated,
   the input clock signal not being derived from the output clock signal,
   wherein the modulated frequency of the output clock signal is obtained by taking an average (arithmetic mean) of k cycles of the input clock signal, where k comprises a predetermined positive integer, and
   wherein said control circuit includes a circuit for generating the control signal in such a manner that said frequency of the output clock signal makes a round trip over said frequency range, which frequency range is stipulated by a second frequency higher by a prescribed amount than a predetermined first frequency and a third frequency lower by a prescribed amount than the first frequency, in an interval that is a prescribed multiple of a period of the input clock signal, and supplying the control signal to said phase interpolator.

15. The apparatus according to claim 14, wherein the control signal supplied from the control circuit to the phase interpolator includes an up signal that advances the phase of the output clock signal and/or a down signal that retards the phase of the output clock signal.

16. The apparatus according to claim 14, wherein the control signal supplied from the control circuit to the phase interpolator includes:
   an up signal that advances the phase of the output clock signal a prescribed amount; and
   a down signal that retards the phase of the output clock signal a prescribed amount; and wherein
   said control circuit includes a circuit for exercising a control so as to activate, a prescribed number of times, the up signal and/or down signal based upon the count result every prescribed number of periods predetermined with regard to the input clock signal, and supply the activated signal to said phase interpolator.

17. The apparatus according to claim 14, wherein the control signal supplied from said control circuit to said phase interpolator includes a down signal that retards the phase of the output clock signal a prescribed amount; and wherein
   said control circuit includes a circuit for exercising control so as to activate, a prescribed number of times, the down signal based upon the count every prescribed number of periods predetermined with regard to the input clock signal, and supply the activated signal to said phase interpolator.

18. The apparatus according to claim 14, wherein the control signal supplied from said control circuit to said phase interpolator includes an up signal that advances the phase of the output clock signal a prescribed amount; and wherein
   said control circuit includes a circuit for exercising control so as to activate, a prescribed number of times, the up signal based upon the count every prescribed number of periods predetermined with regard to the input clock signal, and supply the activated signal to said phase interpolator.

19. The apparatus according to claim 14, wherein said phase interpolator includes a circuit for retarding or advancing the phase of the output clock signal based upon the control signal, with a prescribed resolution serving as a unit of a period of the input clock signal.

20. A serial interface device having the spread spectrum clock generating apparatus as set forth in claim 14.

21. A spread spectrum clock generating apparatus comprising:
   a phase interpolator receiving an input clock signal and a control signal, varying a phase of an output clock signal in accordance with the control signal and outputting the resultant output clock signal; and
   a control circuit receiving and counting the input clock signal, generating the control signal, which is for varying the phase of the output clock signal, based upon a count result, such that a frequency of the output clock makes a round trip over a predetermined frequency range, and supplying the so generated control signal to the phase interpolator,
   the output clock signal being frequency-modulated,
   the input clock signal not being derived from the output clock signal,
   wherein the modulated frequency of the output clock signal is obtained by taking an average (arithmetic mean) of k cycles of the input clock signal, where k comprises a predetermined positive integer, and
   wherein said control circuit includes:
      a frequency divider circuit for receiving the input clock signal and outputting a frequency-divided clock signal obtained by frequency dividing the input clock signal by a prescribed frequency dividing value;
      a first counter for receiving and counting the frequency-divided clock signal output from said frequency divider circuit and, when the frequency-divided clock signal has been counted up to a first predetermined value, outputting a first output signal and resetting the count value to zero;
      a second counter for receiving the first output signal from said first counter and counting the first output signal up and down between predetermined lower-limit and upper-limit count values; and
      an up/down control circuit for receiving the frequency-divided clock signal from said frequency divider circuit and the count values of said first and second counters, and outputting an up signal, which advances the phase of the output clock signal, and/or a down signal, which retards the phase of the output clock signal, to said phase interpolator as the control signal based upon the count values of said first and second counters, at a timing decided by the frequency-divided clock signal.

22. A spread spectrum clock generating apparatus comprising:

a phase interpolator receiving an input clock signal and a control signal, varying a phase of an output clock signal in accordance with the control signal and outputting the resultant output clock signal; and a control circuit receiving and counting the input clock signal, generating the control signal, which is for varying the phase of the output clock signal, based upon a count result, such that a frequency of the output clock makes a round trip over a predetermined frequency range, and supplying the so generated control signal to the phase interpolator, the output clock signal being frequency-modulated, the input clock signal not being derived from the output clock signal, wherein the modulated frequency of the output clock signal is obtained by taking an average (arithmetic mean) of k cycles of the input clock signal, where k comprises a predetermined positive integer, and wherein said control circuit includes:

a frequency divider circuit for receiving the input clock signal and outputting a frequency-divided clock signal obtained by frequency dividing the input clock signal by a prescribed frequency dividing value;

a first counter for receiving and counting the frequency-divided clock signal that is output from said frequency divider circuit and, when the frequency-divided clock signal has been counted up to a first predetermined value, outputting a first output signal and resetting the count value to zero;

a second counter for receiving the first output signal from said first counter and counting the first output signal up and down between predetermined lower-limit and upper-limit count values; and a down control circuit for receiving the frequency-divided clock signal from said frequency divider circuit and the count values of said first and second counters are input for outputting a down signal, which retards the phase of the output clock signal, to said phase interpolator as the control signal based upon the count values of said first and second counters, at a timing decided by the frequency-divided clock signal.

23. A spread spectrum clock generating apparatus comprising:

a phase interpolator receiving an input clock signal and a control signal, varying a phase of an output clock signal in accordance with the control signal and outputting the resultant output clock signal; and a control circuit receiving and counting the input clock signal, generating the control signal, which is for varying the phase of the output clock signal, based upon a count result, such that a frequency of the output clock makes a round trip over a predetermined frequency range, and supplying the so generated control signal to the phase interpolator, the output clock signal being frequency-modulated, the input clock signal not being derived from the output clock signal, wherein the modulated frequency of the output clock signal is obtained by taking an average (arithmetic mean) of k cycles of the input clock signal, where k comprises a predetermined positive integer, and wherein said control circuit includes:

a frequency divider circuit for receiving the input clock signal and outputting a frequency-divided clock signal obtained by frequency dividing the input clock signal by a prescribed frequency dividing value;

a first counter for receiving and counting the frequency-divided clock signal that is output from said frequency divider circuit and, when the frequency-divided clock signal has been counted up to a first predetermined value, outputting a first output signal and resetting a count value to zero;

a second counter for receiving the first output signal from said first counter and counting the first output signal up and down between predetermined lower-limit and upper-limit count values; and an up control circuit receiving the frequency-divided clock signal from said frequency divider circuit and count values of said first and second counters and supplying an up signal, which advances the phase of the output clock signal, to said phase interpolator as the control signal based upon the count values of said first and second counters, at a timing decided by the frequency-divided clock signal.

\* \* \* \* \*